(12) United States Patent
Tsumura

(10) Patent No.: US 10,068,910 B2
(45) Date of Patent: Sep. 4, 2018

(54) NON-VOLATILE SEMICONDUCTOR MEMORY DEVICE

(71) Applicant: SII Semiconductor Corporation, Chiba-shi, Chiba (JP)

(72) Inventor: Kazuhiro Tsumura, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/713,926

(22) Filed: Sep. 25, 2017

(65) Prior Publication Data

US 2018/0090506 A1 Mar. 29, 2018

(30) Foreign Application Priority Data

Sep. 28, 2016 (JP) ................... 2016-190179

(51) Int. Cl.
| | | |
|---|---|---|
| *G11C 11/34* | (2006.01) | |
| *H01L 27/11521* | (2017.01) | |
| *H01L 27/112* | (2006.01) | |
| *H01L 21/8228* | (2006.01) | |
| *H01L 29/423* | (2006.01) | |
| *G11C 17/18* | (2006.01) | |
| *H01L 29/94* | (2006.01) | |
| *G11C 16/02* | (2006.01) | |

(52) U.S. Cl.
CPC ........ *H01L 27/11521* (2013.01); *G11C 16/02* (2013.01); *G11C 17/18* (2013.01); *H01L 21/8228* (2013.01); *H01L 27/11206* (2013.01); *H01L 29/42324* (2013.01); *H01L 29/94* (2013.01)

(58) Field of Classification Search
CPC .......... H01L 27/11521; H01L 21/8228; H01L 27/11206; H01L 29/42324; H01L 29/09; G11C 16/02; G11C 17/18
USPC ..................................................... 365/185.18
See application file for complete search history.

(56) References Cited

U.S. PATENT DOCUMENTS

| | | | |
|---|---|---|---|
| 9,514,818 B1 * | 12/2016 | Roizin | G11C 16/10 |
| 2009/0175085 A1 | 7/2009 | Tsumura | 365/185.18 |
| 2016/0211256 A1 * | 7/2016 | Tsumura | H01L 27/0629 |
| 2017/0345836 A1 * | 11/2017 | La Rosa | H01L 27/11531 |

FOREIGN PATENT DOCUMENTS

JP 2009147002 7/2009

* cited by examiner

*Primary Examiner* — Fernando Hidalgo
(74) *Attorney, Agent, or Firm* — Adams & Wilks

(57) ABSTRACT

Provided is a small-area one-time programmable semiconductor memory device that uses a PNPN structure, which is parasitically generated in a CMOS process. An N-type region provided in a location other than both ends or a P-type region provided in a location other than both the ends is put into a floating state so that PNPN current flows, and a thermal breakdown of a resistor caused by this current is used as a memory element.

12 Claims, 8 Drawing Sheets

NON-VOLATILE SEMICONDUCTOR MEMORY DEVICE

BACKGROUND OF THE INVENTION

1. Field of the Invention

The present invention relates to a one-time programmable non-volatile semiconductor memory device using a PNPN structure.

2. Description of the Related Art

In semiconductor devices currently available, memory elements are used for various purposes. In particular, memory elements capable of keeping stored data even after turn-off of the power supply and permitting a data writing only once are generally called "one-time programmable non-volatile memory element". In the following description, this one-time programmable non-volatile memory element is referred to as "OTP". The abbreviation "OTP" is generally used in the semiconductor industry. OTPs are used for various purposes such as data memory and trimming in semiconductor devices.

OTPs are roughly divided into two types.

The first type is a floating gate type OTP configured to perform writing by storing charges in its floating gate. This type performs writing using weak current, and hence has a characteristic of being weak against erroneous writing due to electrical factors. Erroneous writing occurs easily as follows, for example. Specifically, when large voltage is applied between a source and a drain of a transistor having the floating gate in data reading, channel hot electrons are generated to be injected into the floating gate, with the result that data is written through operation for data reading.

The second type is a thermal breakdown type OTP configured to cause thermal breakdowns in junctions or resistors by supplying large current thereto. This type includes various forms, and all of the forms require a larger current than that of the floating gate type OTP in order to cause thermal breakdown. This is because an OTP of this type requires a large electric power to cause thermal breakdown. The withstanding voltage of the elements and the widths of wires and transistors along the current path should be large in order to handle large current or high voltage. As a result, a necessary occupation area becomes large, but instead, the thermal breakdown type OTP has an advantage over the floating gate type for hardly causing erroneous writing.

An example of a thermal breakdown type OTP is shown in FIG. 10 which is described as FIG. 5 in Japanese Patent Application Laid-open No. 2009-147002. A low ON withstanding voltage NMOS transistor 107 having a role of the memory element and a high ON withstanding voltage NMOS transistor 102 having a role of a switch between the drain of the memory element and the power supply line 101 are serially connected. Writing the OTP is carried out by breaking the low ON withstanding voltage NMOS transistor 107 down into a low impedance state with the current flowing towards the ground line 108 after setting the voltage of the power supply line 101 higher than the drain withstanding voltage of the low ON withstanding voltage NMOS transistor 107 and making the input terminals 109, 110 high level.

Since a relatively high voltage should be applied to break the low ON withstanding voltage NMOS transistor 107, the high ON withstanding voltage NMOS transistor 102 and elements which are used to supply voltage and current to the high ON withstanding voltage NMOS transistor 102 should also have high withstanding voltage, resulting in a large occupation area.

SUMMARY OF THE INVENTION

In view of the foregoing, the present invention has an object to provide a small-area thermal breakdown type OTP.

In order to solve the above-mentioned problems, according to one embodiment of the present invention, there is provided a non-volatile semiconductor memory device, comprising:

a first first-conductivity-type region provided in a semiconductor substrate;

a first second-conductivity-type region in contact with the first first-conductivity-type region;

a second second-conductivity-type region formed in the first first-conductivity-type region; and a second first-conductivity-type region formed in the first second-conductivity-type region, the first first-conductivity-type region being electrically connected to a second-conductivity-type potential which corresponds to VSS when the second-conductivity-type potential is N-type potential and which corresponds to VDD when the second-conductivity-type potential is P-type potential, the second first-conductivity-type region being connected to a first-conductivity-type potential which corresponds to VSS when the first-conductivity-type potential is N-type potential and which corresponds to VDD when the first-conductivity-type potential is P-type potential via a resistor, the first second-conductivity-type region being connected to the first-conductivity-type potential via a switch, the first second-conductivity-type region being electrically connected to the first-conductivity-type potential after turning on of the switch, and the first second-conductivity-type region entering a floating state after turning off of the switch, writing of data being prevented when current being injected from the second second-conductivity-type region with the switch turned on, and writing of data being performed with use of flow of PNPN current when the current being injected from the second second-conductivity-type region with the switch turned off.

The present invention achieves an OTP by controlling whether or not to cause large current to flow through a PNPN structure in a semiconductor substrate.

Although the present invention needs relatively large current for data writing, but most part of current paths is located in the semiconductor substrate. Hence, the present invention needs transistor channels and wires having large widths in a few region. An OTP having a smaller area than in the related art is therefore obtained.

In addition, one of PN structures of the PNPN structure of the present invention can be replaced with an ESD protection element which is included in most of semiconductor devices irrespective of presence or absence of a memory device of the present invention. Also in this respect, an OTP having a smaller area than in the related art is obtained.

DESCRIPTION OF THE EMBODIMENTS

Now, modes for carrying out the present invention are described by way of embodiments.

First Embodiment

Figure 1A:
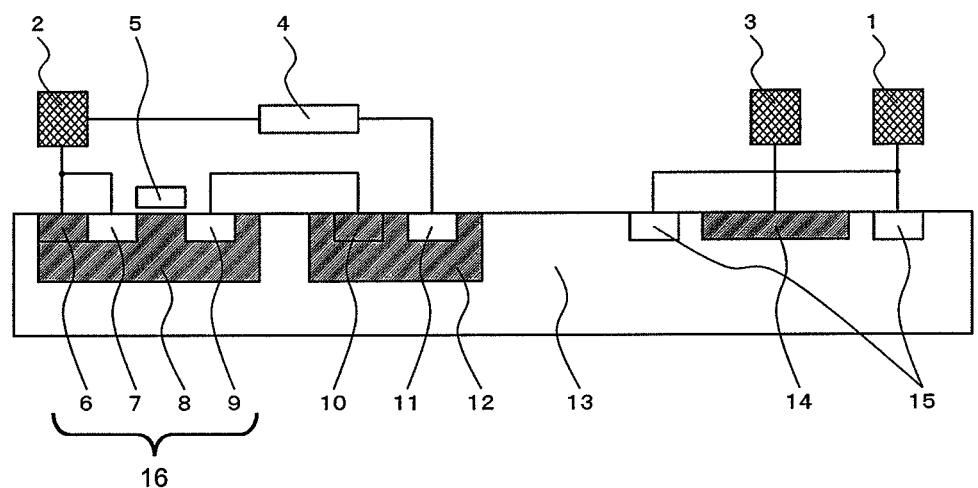
FIG. 1A is a schematic cross-sectional view of an OTP according to an embodiment of the present invention.
Figure 1B:
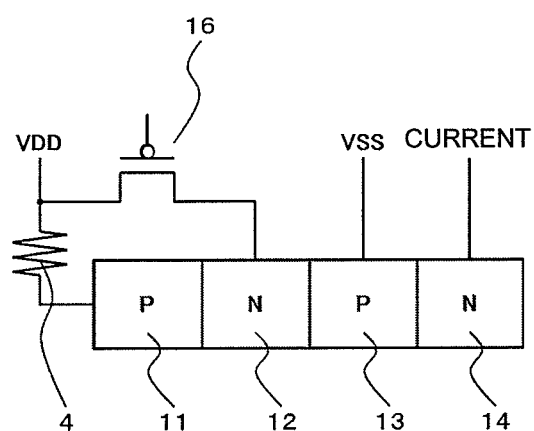
FIG. 1B is a schematic diagram for facilitating the understanding of FIG. 1A.

Effects of the present invention are described with reference to FIG. 1A and FIG. 1B. FIG. 1A is a schematic cross-sectional view of a first embodiment of the present invention. FIG. 1B is a schematic diagram for facilitating the understanding of FIG. 1A. FIG. 1A and FIG. 1B are general electric circuit diagrams except for a PNPN structure. The PNPN structure cannot accurately be expressed by two pairs of PN diodes, and is accordingly illustrated as in FIG. 1B.

The OTP of the first embodiment includes:

a first P-type region 13 and a first N-type region 12 which are in contact with each other;

a second N-type region 14 formed in the first P-type region 13; and a second P-type region 11 formed in the first N-type region 12, the first P-type region 13 being electrically connected to a VSS terminal 1, the second P-type region 11 being connected to a VDD terminal 2 via a resistor 4, the first N-type region 12 being connected to the VDD terminal 2 via a switch 16, in which the first N-type region 12 is electrically connected to the VDD terminal 2 when the switch 16 is turned on, and in which the first N-type region 12 enters a floating state when the switch 16 is turned off.

The switch 16 includes a PMOS transistor having a PMOS source region 7, a PMOS drain region 9, a gate electrode 5, and an N-well 8. The N-well 8 is electrically connected to the VDD terminal 2 via an N-type high-concentration region 6. The PMOS drain region 9 and the first N-type region 12 are electrically connected to each other via an N-type high-concentration region 10. The first P-type region 13 is electrically connected to the VSS terminal 1 via a P-type high-concentration region 15 which has the same polarity as that of the first P-type region 13. The second N-type region 14 is electrically connected to an IO terminal 3. Herein, the term "IO terminal" means a terminal that enables application of potentials other than power supplies such as VDD and VSS.

Current is injected from the IO terminal 3 with the switch 16 being turned off. This corresponds to causing forward current to flow through the PNPN structure, which includes the regions 11, 12, 13, and 14, from the N (14) at the right end while the N (12) sandwiched by the P regions is put into the floating state. The P (11) at the left end which is connected to the VDD via the resistor 4, has a VDD potential, and the P (13) which is second from the right, has a VSS potential. The N (14) at the right end has a lower potential than that of the VSS. As a result, this PNPN structure, is turned on, and PNPN current flows. This current is also called "latch-up current", which is large current that flows through the semiconductor substrate. A thermal breakdown of the resistor 4 occurs with the use of this current.

Meanwhile, current is injected from the IO terminal 3 with the switch 16 being turned on. This corresponds to injecting forward current into the PNPN structure which includes the regions 11, 12, 13, and 14, from the N (14) at the right end while the N (14) at the right end is set to a potential that is lower than that of the VSS under a state in which the N (12) sandwiched by the P regions and the P (11) at the left end are set to the VDD potential, and the P (13) which is second from the right, is set to the VSS potential. In this case, no forward current flows through the PN junction including the N (12) sandwiched by the P regions and the P (11) at the left end, and the PNPN structure is thus not turned on. Technically speaking, current flows through the PNPN structure, but the current is generally lower than that in the case in which the switch 16 is turned off by one digit or more. Hence, this state is generally called a state in which a PNPN structure is not turned on. Alternatively, this state is also called a state in which no latch-up current flows. That is, the thermal breakdown of the resistor 4 does not occur.

The case in which current is injected from the IO terminal 3 with the switch 16 being turned on is described in more detail. Current that has been injected into the second N-type region 14 to which the IO terminal 3 is connected, partly reaches the first N-type region 12. This part of current is taken by the first N-type region 12 and the remaining current passes by the first N-type region 12 to reach the second P-type region 11.

The current taken by the first N-type region 12 flows to the VDD via the switch 16. Consequently, the potential of the first N-type region 12 drops from that of the VDD by "ON resistance of switch 16×current flowing through switch 16".

Further, the current that has reached the second P-type region 11 flows to the VDD via the resistor 4. Consequently, the potential of the second P-type region 11 drops from that of the VDD by "resistance value of resistor 4×current flowing through resistor 4".

When the potential of the first N-type region 12 falls below the potential of the second P-type region 11 by 0.6 V or more, forward current flows through this PN diode, with the result that the PNPN structure is turned on, and latch-up current flows. When the potential of the first N-type region 12 falls below the potential of the second P-type region 11 by less than 0.6 V, forward current does not flow through the PN diode including the second P-type region 11 and the first N-type region 12, and the PNPN structure is thus not turned on. However, current that has been injected into the second N-type region 14 partly reaches the second P-type region 11, which means that current flows through the PNPN structure.

In the present invention, in order to prevent the PNPN structure from being turned on when the switch 16 is turned on, the ON resistance of the switch 16 is set to the resistance value of the resistor 4 or less, for example, when the amount of current taken by the first N-type region 12 and the amount of current that has reached the second P-type region 11 are equal to each other.

When the concentration of the first N-type region 12 is high, the ratio of current that reaches the second P-type region 11 drops. The relative ratio of current varies depending on processes in this way, and hence the resistance value needs to be changed depending on a process that employs the present invention. However, this is only a matter that can be set with the general knowledge about semiconductors as described above.

What is described above is that it is possible to select whether to break the resistor 4 or not, through switching of the switch 16 between ON and OFF. When the resistor is broken, the resistor opens or the resistance value increases by one digit or more. The method of using a resistor as an OTP by changing the resistance value of the resistor is widely used, and hence description thereof is herein omitted.

In addition, the switch 16 described here can be achieved with an element capable of controlling the electric resistance between the first N-type region and the VDD, and is not limited to the PMOS described in the first embodiment. For example, the switch 16 can be achieved with an NMOS. Even in such a case, the essence of the present invention is not lost.

For an accurate understanding of the mechanism of the present invention, there is described a phenomenon that occurs when the first N-type region 12 is input into the floating state, and current that is injected from the IO terminal 3 into the second N-type region 14 is gradually increased from 0 mA to −100 mA. The injected current reaches the first N-type region 12 to be taken by this first N-type region 12, but this first N-type region 12 is in the floating state, and hence the potential of the first N-type region 12 drops from the VDD potential. When the injected current is increased, forward current starts to flow through the PN junction including the second P-type region 11 and the first N-type region 12. As the amount of injected current is increased more, the amount of forward current is increased more. This forward current is partly taken by the first P-type region 13. Then, the voltage of the first P-type region 13 rises. The voltage rises more as the amount of injected current is increased, and a larger forward current flows between the N-type region connected to the IO terminal 3 and the P-type region connected to the VSS. As a result, the PNPN structure which includes the second P-type region 11, the first N-type region 12, the first P-type region 13 connected to the VSS, and the second N-type region 14 connected to the IO terminal 3 is turned on. This corresponds to occurrence of latch-up between the power supplies. The N-type region connected to the IO terminal 3, which is used here for the description, may be an N-type region connected to the VSS in the first P-type region 13, and most of semiconductor devices including N-type transistors have such an N-type region. It is easy to set the configuration so that the thermal breakdown of the resistor 4 does not occur when the PNPN structure including the regions 11, 12, 13, and 14 is turned on as described above, but the thermal breakdown of the resistor 4 occurs only after this latch-up between the power supplies occurs and a larger current flows through the resistor 4. In any case, the PNPN structure including the regions 11, 12, 13, and 14 needs to be turned on.

The main gist of the present invention is to control the PNPN structure between ON and OFF through control of the resistance between the first N-type region 12 and the VDD, with the use of the switch. In the above description, the first N-type region is put into the floating state by turning off the switch, but this does not require the switch to be turned off and fully opened. Also in terms of the ON/OFF of the switch of the transistor, technically speaking, the "ON/OFF" means that the ratio of the resistance values between the ON state and the OFF state is generally $10^6$ or more, and current flows even when the switch is turned off. In other words, the "ON/OFF" is a term for expressing that a signal is "transmitted/not transmitted", which is used for the sake of convenience. That is, the "floating state" means that the potential is easily separated from the VDD potential with current or other disturbance factors.

Second Embodiment

Semiconductor devices are generally required to pass an ESD test. In order to pass this test, in the semiconductor device, an element called "ESD protection element" is connected to many terminals. As the ESD protection element, any of a GGNMOS, a PN diode, and an NPN bipolar transistor each of which has a gate fixed to the ground level is often used.

Figure 2:
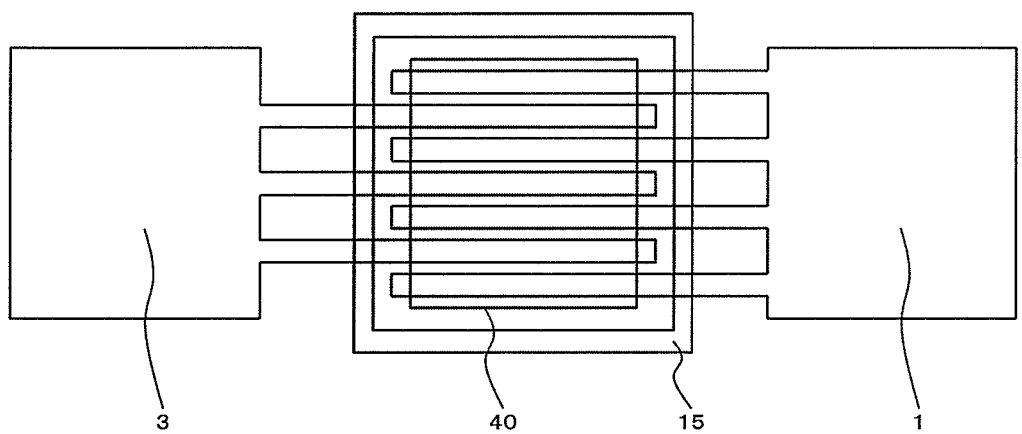
FIG. 2 is a view for illustrating a terminal and an ESD protection element.

FIG. 2 is a plan view of a terminal and a GGNMOS when the GGNMOS is used as an ESD protection element. A source of the GGNMOS and a substrate are connected to the VSS terminal 1, and the other terminal 5 is connected to a drain of the GGNMOS. A gate 40 is fixed to the ground level. In order to pass the specification test, the GGNMOS often has a channel width of several hundred micrometers, and is often arranged to form a comb shape as in FIG. 2. The entire protection element is surrounded by the P-type high-concentration region 15 having the VSS potential. The arrangement described above is the most common arrangement.

In this structure, the IO terminal 3, the second N-type region 14, and the P-type high-concentration region 15 of FIG. 1A and FIG. 1B correspond to the terminal on the left side of FIG. 2, the drain of the GGNMOS of FIG. 2, and the P-type high-concentration region surrounding the GGNMOS of FIG. 2, respectively. That is, the existing terminal and the GGNMOS can be used for the OTP of the present invention even when the OTP of the present invention is not mounted. Mounting of the OTP of the present invention eliminates the need to additionally mount the second N-type region 14 and the P-type high-concentration region 15 of FIG. 1A for the OTP. This is a great advantage for semiconductor devices that are desired to have a smaller area.

As an ESD protection element, a large PN diode or an NPN bipolar transistor is often mounted instead of a GGNMOS. Also in such a case, a large N-type region is connected to a terminal and the ESD protection element is surrounded by a high-concentration P-type region having the VSS potential in many cases. Thus, in all the cases described above, the existing terminal and the ESD protection element therefor can be used for the OTP of the present invention even when the OTP of the present invention is not mounted.

The semiconductor devices are generally required to pass a latch-up test in addition to the ESD test. In the latch-up test, it is required for the semiconductor device not to be broken even when a current of ±100 mA is injected into a terminal other than power supplies under a state in which the VDD and the VSS are applied. General semiconductor devices are accordingly manufactured so that the semiconductor device does not break even when a current of ±100 mA is injected thereinto from a terminal other than power supply terminals. Thus, without addition of special measures, in writing in the OTP of the present invention, components except for an OTP cell intended to perform writing are not broken when a current of −100 mA is injected from the IO terminal 3. Here, the fact that elements except for an OTP cell do not break is emphasized because unintended latch-up often causes a thermal breakdown of elements that are not intended to break.

Even when the OTP of the present invention is not mounted and an existing terminal and an ESD protection element therefor are used, the existing terminal and the ESD protection element cannot be arranged closely, which means that the first P-type region 13 is long and hence a distance from the first N-type region 12 to the second N-type region 14 is large. As the distance increases, the ratio of current that is injected from the second N-type region 14 and reaches the first N-type region 12 gradually decreases, leading to a concern that the PNPN structure may not be turned on. With regard to this, it is confirmed that the PNPN structure is turned on even with a distance of 100 μm, and the distance does not prevent using the existing terminal and the ESD protection element for the OTP.

Here, as the ESD protection element, the GGNMOS, the PN diode, and the NPN bipolar transistor are given, but the ESD protection element is not limited thereto.

Further, not only the ESD protection element, but also an output transistor having a terminal connected to a drain of an N-type MOS can double as part of the OTP of the present invention. This is because N-type MOSs and GGNMOSs have the same structure except for gate wiring. Further, the same also applies to a case in which an NPN bipolar transistor is used as an output transistor.

Third Embodiment

When the switch 16 in the first embodiment is set to be normally on, the switch 16 can be positively on even in a case in which a terminal for controlling the switch opens or failure occurs on the middle of the wiring path, for example. In this way, the switch 16 is set to be positively on in a period other than writing, and it is therefore possible to further reduce a possibility that failure somehow occurs to make erroneous writing.

Figure 3:
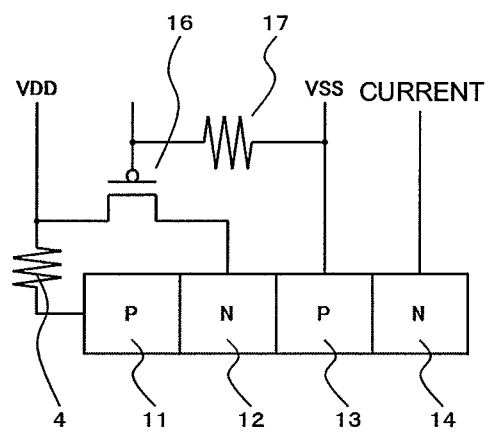
FIG. 3 is a diagram for illustrating an OTP according to an embodiment of the present invention to which a pull-down resistor is added.

The switch 16 can be set to be normally on by a resistor 17 provided between the gate of the switch 16 and the VSS as illustrated in FIG. 3. Such a resistor 17 lowers the potential of the gate to a low level, and hence is often called "pull-down resistor".

The switch 16 needs to be turned off in writing even when the resistor 17 is provided, and hence the resistance value of the resistor 17 needs to be set to a value that does not prevent the switch 16 from being turned off.

Fourth Embodiment

When an OTP cell having a write inhibition function is mounted, it is possible to more positively prevent erroneous writing which occurs after writing. How this is achieved is described with reference to FIG. 4.

Figure 4:
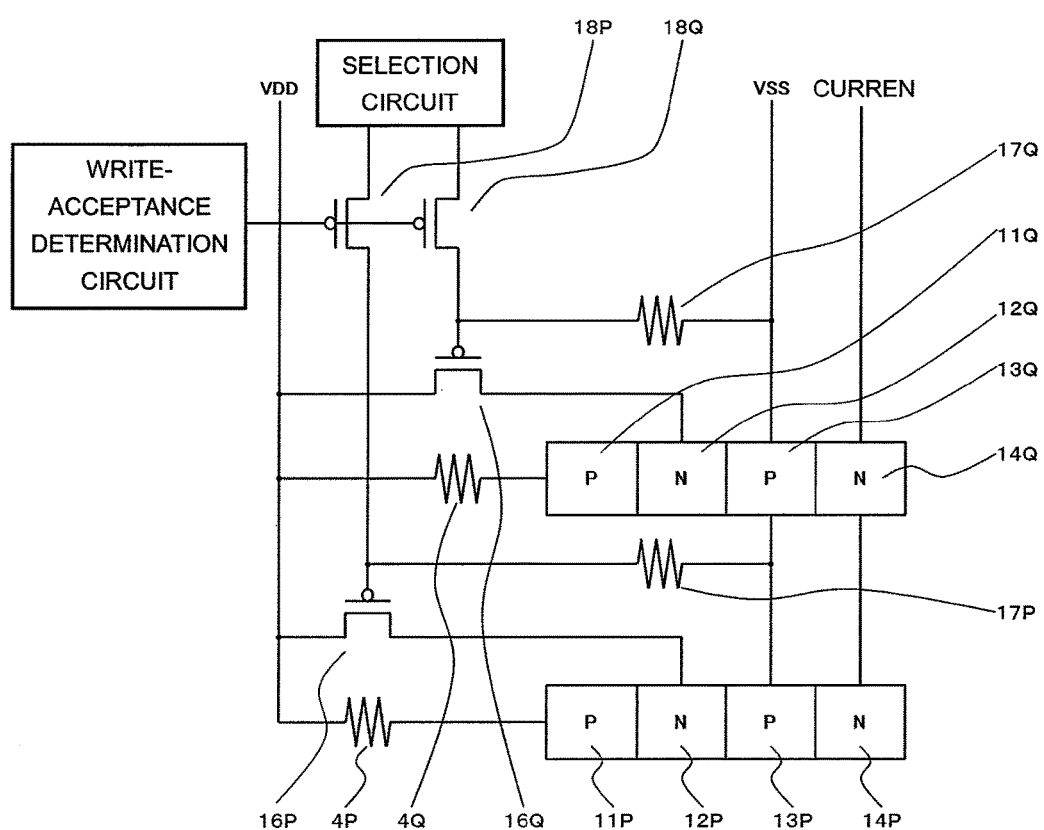
FIG. 4 is a diagram for illustrating an OTP according to an embodiment of the present invention that has a write inhibition function.

FIG. 4 is a diagram of a case in which two OTP cells for data memory are mounted. One of the OTP cells includes a PNPN structure including regions 11P, 12P, 13P, and 14P, a switch 16P configured to control the PNPN structure between ON and OFF, and a resistor 4P. The other OTP cell has a similar configuration, and includes a PNPN structure including regions 11Q, 12Q, 13Q, and 14Q, a switch 16Q configured to control the PNPN structure between ON and OFF, and a resistor 4Q.

The OTP enters a write inhibition mode when a High signal is input from a write-acceptance determination circuit, and enters a writable mode when a Low signal is input therefrom. First, the writable mode is described. When a Low signal is input from the write-acceptance determination circuit, a PMOS 18P and a PMOS 18Q configured to receive a signal from the write-acceptance determination circuit are both turned on. A signal from a selection circuit is thus transmitted to the switches 16P and 16Q which are configured to control the PNPN structures between ON and OFF.

Further, inputs for the switches 16P and 16Q which are configured to control the PNPN structures between ON and OFF are connected to the VSS via resistors 17P and 17Q so that the switches 16P and 16Q are normally on as in the description of the third embodiment. Since too small resistance values of the resistors 17P and 17Q impede correct transmission of a High signal from the selection circuit to the switches 16P and 16Q, the resistors 17P and 17Q accordingly have resistance values that allow correct transmission of High signals.

When a High signal is input from the selection circuit, as described in the first embodiment, the first N-type region 12 enters the floating state, and writing is thus performed. On the other hand, when a Low signal is input from the selection circuit, the first N-type region 12 is given the VDD potential, and writing is thus not performed. In this way, in the writable mode, writing can be performed only on an OTP cell intended to perform writing, depending on a signal from the selection circuit.

Next, the write inhibition mode is described. When a High signal is input from the write-acceptance determination circuit, the PMOSs 18P and 18Q are turned off, and the selection circuit and the inputs of the switches which are configured to control the PNPN structures are not electrically connected to each other. The inputs of the switches which are configured to control the PNPN structures are connected to the VSS via the resistors, and hence the switches which are configured to control the PNPN structures are turned on irrespective of the level of a signal from the selection circuit. That is, the first N-type region 12 is connected to the VDD irrespective of the level of a signal from the selection circuit. Consequently, writing cannot be performed on the OTP irrespective of the level of a signal from the selection circuit.

Figure 5:
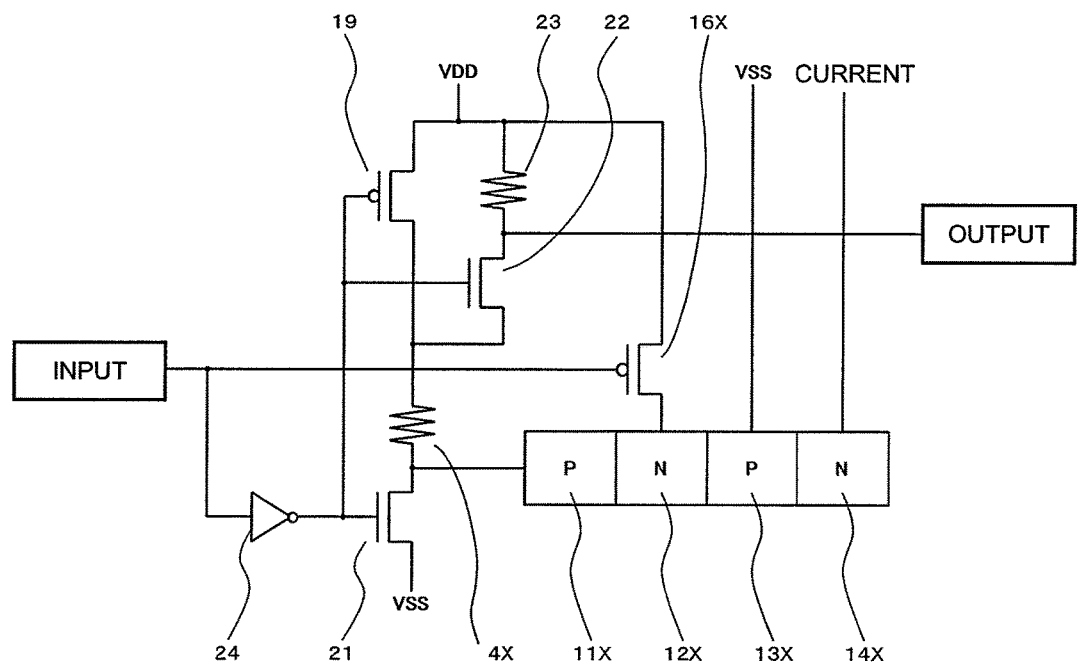
FIG. 5 is a diagram for illustrating a write-acceptance determination circuit.

Next, how the write-acceptance determination circuit is achieved is described with reference to FIG. 5. The write-acceptance determination circuit includes one OTP cell, and this OTP includes a PNPN structure including regions 11X, 12X, 13X, and 14X, a switch 16X configured to control the PNPN structure between ON and OFF, and a resistor 4X. The fourth embodiment differs from the first embodiment in that a PMOS 19 is inserted between the resistor 4X and the VDD. The ON resistance of the PMOS 19 is set to a sufficiently small value so that the PMOS 19 does not prevent the mechanism that performs writing by turning on the PNPN structure which is described in the first embodiment.

When receiving a Low signal from an input, an inverter 24 outputs a High signal, and thus NMOSs 21 and 22 are turned on and the PMOS 19 is turned off. The resistance value of a resistor 23 is set to a value that is larger than the total of the resistance value of the resistor 4X, the ON resistance of the NMOS 21, and the ON resistance of the NMOS 22. With this, the output has a potential of Low at this time. The OTP thus enters the writable mode.

When a Low signal is entered from the input, the switch 16X which is configured to control the PNPN structure is turned on, and writing is thus not performed on the OTP in the write-acceptance determination circuit.

When receiving a High signal from the input, the inverter 24 outputs a Low signal, and the NMOSs 21 and 22 are thus turned off. This means that the resistor 4X and the second P-type region are not electrically connected to the VSS, and the resistor 23 and the resistor 4X are not electrically connected to each other. As a result, a High signal is output, and the OTP thus enters the write inhibition mode.

Further, when a High signal is input from the input, the switch 16X which is configured to control the PNPN structure is turned off, and the OTP in the write-acceptance determination circuit is enters the writable state.

In conclusion, when a Low signal is input from the input, the OTP in the write-acceptance determination circuit enters the non-writable state, but the OTP for data memory enters the writable state. In contrast, when a High signal is input from the input, the OTP in the write-acceptance determination circuit enters the writable state, but the OTP for data memory enters the non-writable state.

When a current of −100 mA is injected from the second N-type region 14X under a state in which a High signal is input from the input, a thermal breakdown of the resistor 4X occurs. This means that writing is performed on the OTP in the write-acceptance determination circuit. When writing is performed on the OTP in the write-acceptance determination circuit, the resistor 4X opens, and a High signal is output irrespective of the level of a signal from the input, with the result that the OTP enters the write inhibition mode.

The case in which the two OTP cells for data memory are provided is described above, and it is easy to increase the number of OTP cells to three or more based on the above description. Exemplary means including the OTP, for achieving the write inhibition function is described above. The means for achieving the write inhibition function is not the main object of the present invention, and hence the present invention is not limited to the means described here.

Fifth Embodiment

In a semiconductor device having mounted thereon a plurality of OTP cells according to a fifth embodiment of the present invention, the plurality of OTP cells share the first P-type region and the second N-type region. With this configuration, writing can be performed only on an OTP cell intended to perform writing.

Figure 6:
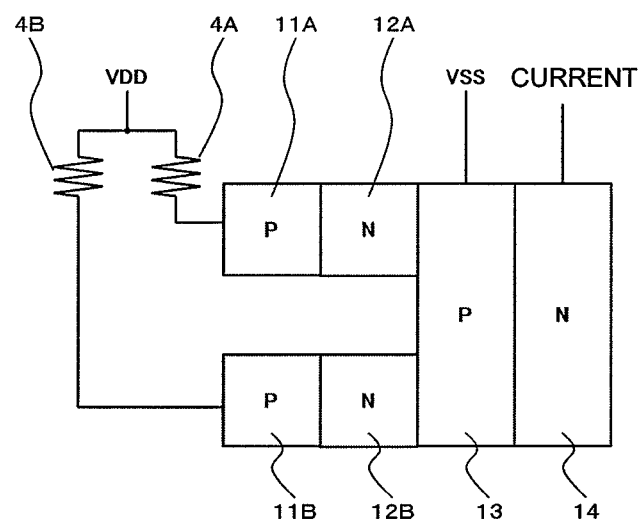
FIG. 6 is a diagram for illustrating two OTP cells that share a first P-type region and a second N-type region according to an embodiment of the present invention.

The reason is described with reference to FIG. 6. FIG. 6 is an illustration of a case in which two OTP cells are included. The switch 16 is necessary for the OTP of the present invention, but the description can be given without the illustration of the switch 16. Hence, the switch 16 is omitted in FIG. 6.

One of the two OTP cells includes a resistor 4A, a second P-type region 11A, a first N-type region 12A, the first P-type region 13, and the second N-type region 14. The other OTP cell includes a resistor 4B, a second P-type region 11B, a first N-type region 12B, the first P-type region 13, and the second N-type region 14. The first P-type region and the second N-type region are common to two cells.

In the two OTP cells, the first N-type region 12A is put into the floating state, and the first N-type region 12B which is the other first N-type region is set to the VDD potential. This is achieved by a method as the one in the fourth embodiment. Under this state, a current of −100 mA is injected from the common second N-type region 14. When a plurality of resistors are connected in parallel to each other, current flow is distributed based on the relationship of "current=voltage/resistance".

Hence, current that flows through the regions 11A and 12A is much larger than current that flows through the regions 11B and 12B, and a thermal breakdown of the resistor 4A occurs. Meanwhile, large current does not flow through the resistor 4B, and a thermal breakdown of the resistor 4B, thus, does not occur. That is, writing can be selectively performed on the two OTP cells that share the first P-type region 13 and the second N-type region 14. It is easy to imagine a case of using three or more cells based on the above description.

Sixth Embodiment

Figure 7:
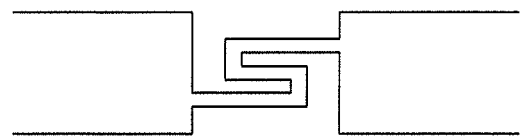
FIG. 7 is a diagram for illustrating a snake-like resistor.

FIG. 7 is a plan view for illustrating an example of the resistor 4. The shape of a resistor that is not linear but is bent twice is referred to as "snake-like shape". In general large current flowing through the resistor generates heat, making the temperature of the resistor high. The temperature conducts to its surroundings, also making the temperature of the surroundings high. As the temperature of the surroundings increases, the temperature of the resistor decreases. That is, large heat conductivity to the surroundings needs large current for a thermal breakdown.

In the case of the snake-like shape as in FIG. 7, the temperature at the periphery of the central portion of the resistor becomes high by the help of both end portions of the resistor. Hence, the temperature of the central portion of the resistor becomes higher than that of the end portions of the resistor. That is, current necessary for a thermal breakdown of the resistor is smaller than that for a thermal breakdown of a resistor having a linear shape.

Seventh Embodiment

Temperature increases as electric power increases, and decreases when heat radiation or heat content is large. Electric power is expressed by an equation "electric power=current×voltage=square of current×resistance". Heat content of the same material is proportional to the volume.

The resistor 4 made of polysilicon is a resistor having higher resistance than that of a resistor made of metal because polysilicon has higher resistivity than those of metals such as aluminum and copper. Hence, the resistor made of polysilicon consumes larger electric power than that of the resistor made of metal under the same current flow. Further, the resistor made of polysilicon has lower heat conductivity and heat radiation performance than those of the resistor made of metal. Both characteristics help the resistor to get high temperature. Thus, the resistor 4 can be broken with a smaller current. This means that current necessary for writing is reduced. The seventh embodiment differs from other embodiments only in material, and hence the drawing of the seventh embodiment is omitted.

Eighth Embodiment

Figure 8A:
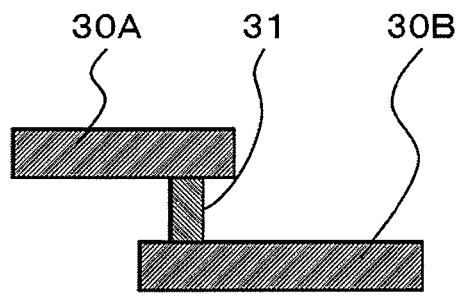
FIG. 8A, FIG. 8B, and FIG. 8C are diagrams for illustrating a resistor using an interconnection.
Figure 8B:
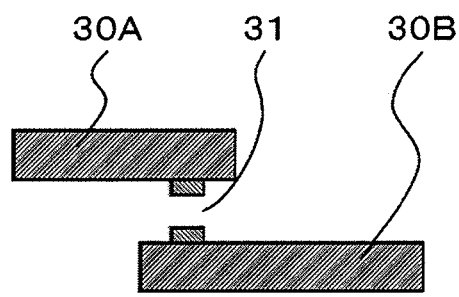
Figure 8C:
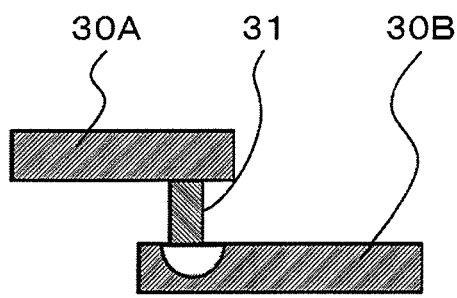

Description is given with reference to FIG. 8A to FIG. 8C. A wiring layer 30A is a metal wire made of aluminum or copper, or is made of polysilicon. A wiring layer 30B which is different from the wiring layer 30A, is a metal wire made of aluminum or copper, is made of polysilicon, or is a silicon substrate. The wiring layers are electrically connected to each other by an interconnection 31. This interconnection is commonly known as "via" or "contact".

This interconnection is often made of tungsten. Tungsten has higher resistivity than those of aluminum and copper, and hence current necessary for writing is reduced when the resistor 4 is formed by the interconnection, based on the above description of the seventh embodiment. FIG. 8A is a diagram for schematically illustrating an interconnection portion before writing, and FIG. 8B is a diagram for schematically illustrating a case in which a thermal breakdown of the interconnection portion occur.

Ninth Embodiment

The boiling point of tungsten, which is used for the interconnection, is higher than that of aluminum or copper, which is used for the wiring layers. Hence, the following case is assumed. Specifically, a thermal breakdown of the interconnection does not occur when the temperature of the interconnection becomes higher than that of the wires. Instead the wire region, which has a lower boiling point than that of the interconnection, in contact with the interconnection receives heat from the interconnection to get high temperature. A thermal breakdown of the wire region in contact with the interconnection then occurs before a thermal breakdown of the interconnection. FIG. 8C is a schematic diagram for illustrating this thermal breakdown.

When the wiring layers are made of polysilicon, the thermal breakdown of the region in contact with the interconnection can occur with a smaller writing current as illustrated in FIG. 8C, because polysilicon itself serves as a resistor and thus generates heat, and has a smaller heat radiation performance than that of metal.

Tenth Embodiment

When a large current of −100 mA is injected from the second N-type region, an uneven potential distribution is formed in the first N-type region due to the relatively high resistance value of the first N-type region. In order to turn on the PNPN structure, forward current of the diode needs to flow, but current necessary for turning on the PNPN structure fluctuates when the potential distribution in the first N-type region is uneven.

Further, the amount of current that reaches the second P-type region changes depending on whether or not the current passes through the N-type high-concentration region 10 in FIG. 1A. This is because regions having different concentrations have different charge taking ratios. This is also a factor of the fluctuation.

Figure 9:
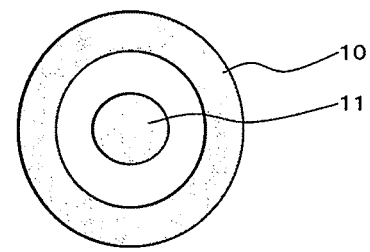
FIG. 9 is a plan view of a first N-type region and a second P-type region.
Figure 10:
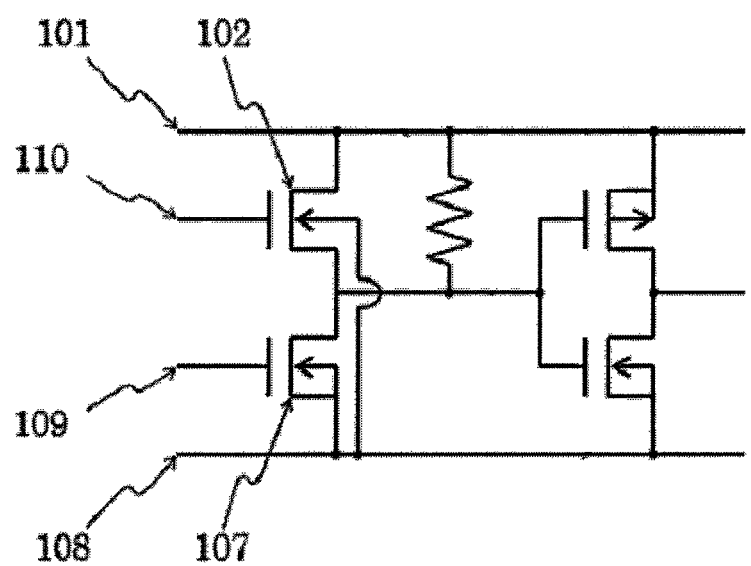
FIG. 10 is a diagram for illustrating the related art.

In view of the above, as illustrated in FIG. 9, the second P-type region 11 is surrounded by the N-type high-concentration region 10. The high-concentration N-type region has low resistance, and hence the uniformity of potential distribution is increased, leading to a reduction in fluctuation. Further, the ratio of current that passes by the first N-type region to reach the second P-type region is the same for current that flows from any direction.

Eleventh Embodiment

In the OTP of the present invention, which uses the flow of large current after turning on of the PNPN structure, when the resistor 4 has low resistance, the following case is assumed. Specifically, in accordance with the principle of the seventh embodiment, while the temperature of the resistor 4 does not rise much, the temperature of a PN junction portion rises instead when the area of the PN junction is small. Then, a thermal breakdown of the PN junction portion occurs at a PN junction portion between the first P-type region and the second N-type region or a PN junction portion between the first N-type region and the second P-type region.

In the above description, a current of −100 mA is injected in writing, but writing is not limited to the injection of a current of −100 mA. The OTP can be designed so that writing can be performed even with a current of −10 mA, or that writing cannot be performed with a current of −100 mA but can be performed with injection of a current of −200 mA, for example, based on the embodiments described so far.

Similar writing can be performed with voltage application of, for example, −1 V instead of current injection. This is because current is eventually injected even with voltage application. Further, voltage takes a relative value, and hence writing in the OTP described in the present invention can be performed by connecting the second N-type region to the ground, and gradually increasing the potential of the first P-type region from the ground.

Twelfth Embodiment

The configuration of the PNPN structure is not limited to the configuration of FIG. 1A. A semiconductor engineer can easily analogize, for example, an OTP in accordance with the principle of the present invention that includes an N-type semiconductor substrate. In the above description, the switch is arranged between the VDD and the first N-type region. However, an OTP having the same principle as the present invention can be achieved with a configuration in which the switch is arranged between the first P-type region and the VSS instead, the first P-type region is put into the floating state, and current is injected from the second P-type region.

Figure 11:
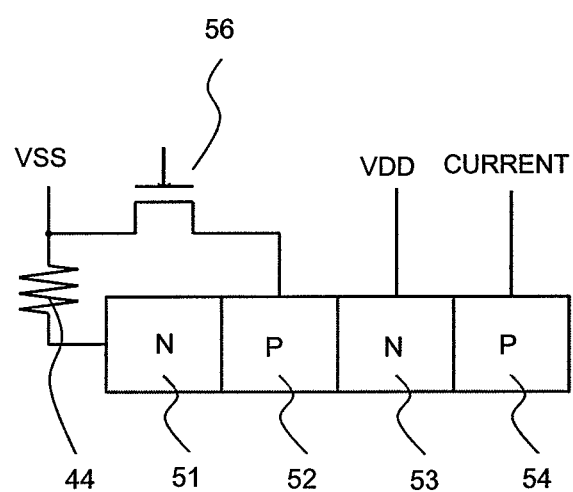
FIG. 11 is a schematic diagram in which P-type region and N-type region of FIG. 1B are mutually interchanged.

A corresponding structure to an OTP shown by FIG. 1B in the first embodiment, for example, can be formed on the N-type semiconductor substrate and is shown by FIG. 11 as the twelfth embodiment. The OTP of the twelfth embodiment includes:

a first N-type region 53 and a first P-type region 52 which are in contact with each other;

a second P-type region 54 formed in the first N-type region 53; and a second N-type region 51 formed in the first P-type region 52, the first N-type region 53 being electrically connected to a VDD terminal 2, the second N-type region 51 being connected to a VSS terminal 1 via a resistor 44, the first P-type region 52 being connected to the VSS terminal 1 via a switch 56, in which the first P-type region 52 is electrically connected to the VSS terminal 1 when the switch 56 is turned on, and in which the first P-type region 52 enters a floating state when the switch 56 is turned off.

When the switch 56 is turned off, the PNPN structure turns on by the current injected to the second P-type region 54 from the IO terminal 3, thermally breaking the resistor 44. When the switch 56 is turned on, the PNPN structure does not turn on even the current is injected to the second P-type region 54 from the IO terminal 3, preventing the resistor from the thermal breakage.

As described above, an OTP can be constructed on the N-type semiconductor substrate without difficulties in accordance with the principle of the present invention In the above description, the resistor is arranged between the PNPN structure and the VDD or between the PNPN structure and the VSS, but the resistor may be arranged in any place on the PNPN path in accordance with the principle of the present invention.

Further, a general CMOS process often includes the following steps. Specifically, in a P-type silicon substrate, an N-type buried layer is formed, a P-type region is formed to be electrically separated from the P-type silicon substrate, and an N-type region is formed in the P-type region. A PNPN structure of this type can be easily analogized.

What is claimed is:

1. A non-volatile semiconductor memory device, comprising:
    a first first-conductivity-type region provided in a semiconductor substrate;
    a first second-conductivity-type region in contact with the first first-conductivity-type region;
    a second second-conductivity-type region formed in the first first-conductivity-type region; and
    a second first-conductivity-type region formed in the first second-conductivity-type region,
    the first first-conductivity-type region being electrically connected to a second-conductivity-type potential which corresponds to VSS when the second-conductivity-type potential is N-type potential and which corresponds to VDD when the second-conductivity-type potential is P-type potential,
    the second first-conductivity-type region being connected to a first-conductivity-type potential which corresponds to VSS when the first-conductivity-type potential is N-type potential and which corresponds to VDD when the first-conductivity-type potential is P-type potential via a resistor,
    the first second-conductivity-type region being connected to the first-conductivity-type potential via a switch, the first second-conductivity-type region being electrically connected to the first-conductivity-type potential after turning on of the switch, and the first second-conductivity-type region entering a floating state after turning off of the switch,
    writing of data being prevented when current being injected from the second second-conductivity-type region with the switch turned on, and
    writing of data being performed with use of flow of PNPN current when the current being injected from the second second-conductivity-type region with the switch turned off.

2. A non-volatile semiconductor memory device according to claim 1, wherein the second second-conductivity-type region comprises one of an second-conductivity-type region of an ESD protection element and an second-conductivity-type region of an second-conductivity-type output transistor.

3. A non-volatile semiconductor memory device according to claim 1, wherein the switch is normally on.

4. A non-volatile semiconductor memory device according to claim 1, wherein the non-volatile semiconductor memory device has a write inhibition mode function.

5. A non-volatile semiconductor memory device, comprising a plurality of the non-volatile semiconductor memory devices of claim 1,
    wherein the plurality of the non-volatile semiconductor memory devices share the first first-conductivity-type region and the second second-conductivity-type region.

6. A non-volatile semiconductor memory device according to claim 1, wherein a thermal breakdown of the resistor occurs in writing the data.

7. A non-volatile semiconductor memory device according to claim 1, wherein the resistor is bent at least twice in a planar view.

8. A non-volatile semiconductor memory device according to claim 1, wherein the resistor is made of polysilicon.

9. A non-volatile semiconductor memory device according to claim 1, wherein the resistor comprises an interconnection for connecting different wiring layers to each other.

10. A non-volatile semiconductor memory device according to claim 9, wherein a thermal breakdown of a wiring region in contact with the interconnection for connecting different wiring layers to each other occurs in writing the data.

11. A non-volatile semiconductor memory device according to claim 1, wherein the second first-conductivity-type region is surrounded by a high-concentration second-conductivity-type region in a planar view, the high-concentration second-conductivity-type region having the same polarity as a polarity of the first second-conductivity-type region.

12. A non-volatile semiconductor memory device according to claim 1, wherein a thermal breakdown of a PN junction portion occurs in writing the data.

* * * * *